United States Patent [19]

Passlick

[11] 4,336,100
[45] Jun. 22, 1982

[54] METHOD OF PRODUCTION OF ELECTRICALLY CONDUCTIVE PANELS AND INSULATING BASE MATERIALS

[75] Inventor: Theodor Passlick, Burgstemmen, Fed. Rep. of Germany

[73] Assignee: Kollmorgen Technologies Corporation, Dallas, Tex.

[21] Appl. No.: 264,857

[22] Filed: May 18, 1981

Related U.S. Application Data

[63] Continuation of Ser. No. 937,209, Aug. 28, 1978, abandoned.

[30] Foreign Application Priority Data

Aug. 30, 1977 [DE] Fed. Rep. of Germany ....... 2739494

[51] Int. Cl.³ .............................................. C23F 1/02
[52] U.S. Cl. ..................................... 156/630; 29/852; 156/252; 156/280; 156/634; 156/645; 156/659.1; 156/901; 174/68.5; 427/97
[58] Field of Search ................ 156/629, 630, 632–634, 156/645, 656, 659.1, 666, 252, 278, 280, 901, 902; 427/96, 97, 98, 302, 304, 305, 306, 322; 174/68.5; 29/846, 852, 848

[56] References Cited

U.S. PATENT DOCUMENTS

| | | | |
|---|---|---|---|
| 3,334,395 | 8/1967 | Cook et al. | ............................ 29/852 |
| 3,435,127 | 3/1969 | Rose et al. | ...................... 174/68.5 X |
| 3,801,427 | 4/1974 | Morishita et al. | .............. 156/630 X |
| 3,934,334 | 1/1976 | Hanni | ................................ 427/97 X |
| 3,969,816 | 7/1976 | Swengel et al. | ................ 174/68.5 X |

*Primary Examiner*—William A. Powell
*Attorney, Agent, or Firm*—Morgan, Finnegan, Pine, Foley & Lee

[57] ABSTRACT

Molded laminates useful in the preparation of electrically conductive panels are provided by a method comprising providing an article comprising a metal carrier or support layer, at least one insulating layer and a copper outer layer, the carrier having a plurality of perforations therethrough which are substantially filled with the insulating material, and compressing the layered article to produce a molded laminate. In other embodiments, the method comprises the further steps of forming a hole through at least some of the filled perforations, and, if desired, sensitizing the walls of the holes to electroless metal deposition and depositing a layer of metal thereon. Articles produced by the methods of this invention are also provided.

8 Claims, No Drawings

METHOD OF PRODUCTION OF ELECTRICALLY CONDUCTIVE PANELS AND INSULATING BASE MATERIALS

CROSS REFERENCE TO RELATED APPLICATION

This is a continuation of application Ser. No. 937,209, filed Aug. 28, 1978, now abandoned.

This invention relates to methods for the production of electrically conductive panels in which the material of the conductive pathways consists of a preformed wirelike material or, in the case of printed circuits, a metal foil or film, and to base materials useful in the production of such panels.

BACKGROUND OF THE ART

In general, conductive panels of the foregoing type consist of a carrier or support comprised of an insulating material, e.g., a molded laminate material comprised of impregnated paper or glass fabric, which supports conductive pathways on its surface or embedded in the carrier, and, where necessary, in two or more planes. Likewise, conductive panels of this type are normally provided with perforations, the walls of which have a metallic layer in mechanical and electrical contact with associated conductive paths.

It has been proposed to make use of a metallic material as a base for the conductive paths, in which the metallic carrier is, first of all, provided with perforations, the walls of which are to carry a metal layer in the finished conductive panel. The surface, inclusive of the walls of the holes, is then provided by the whirl-sintering method with a layer of insulating material, to which the conductive paths are then applied.

Conductive panels having a carrier comprised of metal, the conductive pathways of which are made after the style of printed circuits in a known manner by subtractive or additive methods, or combinations of such methods, possess a number of disadvantages, however. For the application of the whirl-sintering layer elaborate apparatus and complicated techniques differing fundamentally from ordinary methods of production of conductive panels, are needed. Moreover, the application of the insulating layer by the whirl-sintering methods leads to an hour-glass-like shape in the walls of the holes.

In order to achieve useful thicknesses for the insulating layer at the edges of the holes it is necessary to tolerate relatively very thick insulating layers on the surface and in the middle of the hole. In addition, because of the peculiarity of the structure of the insulating layer, it is necessary to start off with holes of a relatively large diameter in the metal carrier. The poor utilization of the surface as a result is opposed to the construction of conductive panels having a high density of conductive paths. The employment of modern electronic component parts requires conductive panels having high conductive path density, however.

It has been proposed to perform the line-up by means of electrophoresis. Apart from this technique being unusual in conductive panel technology, and, moreover, relatively elaborate, the aforementioned disadvantages also occur. In particular, it is difficult or impossible to achieve a uniform coating in the walls of the holes.

The application of insulating layers by flame spraying and other methods proposed in the prior art has, likewise, not let to any technically and economically useful results.

For metal carriers comprised of aluminum, it has been proposed to apply an insulating layer by means of electrooxidation. But the resulting layers of insulating material possess mechanical properties which are not suitable for the production of conductive panels comprised of metal carriers.

For conductive panels in which the material of the conductive paths consists of a preformed wirelike material provided with an insulating layer, the wirelike material of the conductive paths is applied first, in order to apply drilled holes which pass through the appropriate conductive paths and which are carried into or, respectively, through the carrier material. Pre-perforated carrier panels provided with an insulating layer by whirl-sintering or in some other way with holes the walls of which are equipped with an insulating layer, are therefore, fundamentally unsuitable for the production of conductive panels of this type.

On the other hand, there exists a need for conductive panels of this kind because of the high strength thereby achievable, and also because the newer semiconductor components have made possible an extraordinary miniaturization of electronic apparatus the limits to which are determined, however, by the dissipation of heat.

Conductive panels having a base comprised of a molded material and the like are distinguished by relatively poor heat conductivity and, hence, heat dissipation, whereas the use of metal carriers leads to a fundamental improvement in this respect.

An object of this invention is to provide methods for producing electrically conductive panels having metal carriers which are free of the afore-stated disadvantages of the prior art and which are useful for the production of conductive panels the conductive pathways of which consist of a preformed wirelike material. This object is realized by this invention, which is described herein.

DESCRIPTION OF THE INVENTION

In accordance with this invention, the carrier material for the conductive paths consists of metal or exhibits a metal core, and the material of the conductive paths consists of preformed wirelike material of any desired cross-section or, respectively, of a metal foil or metal film produced by means of methods of subtraction or addition of metal, or a combination of both. The method is characterized in that the metal carrier or, respectively, the carrier material provided with a metal core is first provided with perforations the diameters of which are greater than the desired hole diameter for the finished conductive panel. After the deburring and cleaning of the carrier, a layered structure is produced so that the surface of the metal carrier is provided on one or both sides with one or more coats or layers of insulating material yielding free flow of heat, and the external surface is provided, where necessary, with a copper foil. The layered structure thus formed is compressed under heat and pressure. A molded laminate is thus produced in which the perforations in the carrier are completely or substantially filled with an insulating material. After this, the electrically conductive panel is completed by known means, in which case at a suitable point during the course of the method the perforations filled up with insulating material are provided with perforations, e.g., drilled holes of the desired diameter.

It is preferable to build up the insulating layer of one or more layers of "prepregs", for example, ones having a high flow rate. So-called "no-flow" and "low-flow" prepregs are also suitable, in which case, however, the pressing conditions must be correspondingly adapted. By way of illustration, if prepegs are used the resin content of which amounts to 60% and which have a flow of 40% and if, for example, the diameter of hole in the metal carrier is selected to be greater by 0.20 to 1 mm, and preferably by 0.4 to 0.8 mm, than that in the finished conductive panel; and if pressing is performed at a temperature of, for example, 150°–200° C., preferably 172° C., a pressure of 10 to 25 bar, preferably 15 to 18 bar, for a period of 15 to 140 minutes, preferably 40 minutes, a solid connection results between the insulating layer and the metal carrier in which the aforementioned performations are completely or almost completely filled with insulating material and, thus, the walls of the holes are covered over with a sufficient coating of insulating material.

In a subsequent step, in accordance with the invention a drilled or punched hole is produced in the perforations filled with insulating material, which in its form fully meets all of the claims for the walls of holes in conductive panels having a metal coating on those hole walls.

Conductive panels having metal carriers are thus produced according to this invention in a simple and economical way, the walls of the holes of which are provided with a metal coating. The method avoids all of the disadvantages of the prior art.

In those embodiments where a copper foil is used for completing the surface, it is advantageous to pretreat the side of the copper foil which is to be connected to the resin layer in the known maner, e.g., by oxidation.

In accordance with the method of the present invention, the perforations which have been preformed in the metal carrier are filled completely with an insulating material. This enables, in a subsequent step of the method, the preparation of preforations, e.g., by drilling, the hole walls of which do not possess an hourglass shape but which are instead substantially cylindrical and whereby an insulating layer of uniform thickness covers the hole wall, including the edges of the hole. The previously described disadvantages of the hitherto known methods are thus avoided. At the same time, the method of this invention enables the production of metal carriers to be used for conductive panels and their conductive paths produced from a preformed wire- or strip-like material, which, preferably, is provided with an insulating layer.

Consequently, the method of this invention enables the economical manufacture of conductive panels having a metal core which are characterized by a high degree of reliability.

DESCRIPTION OF THE SPECIFIC EMBODIMENTS

The following examples illustrate methods in accordance with the invention. These are not to be construed as limiting the invention.

EXAMPLE 1

(a) A panel-like material of aluminum having a thickness of 0.4 mm is first cut up and then provided by stamping or drilling with holes the diameter of which is chosen to be greater by 0.7 mm than the diameter desired for the finished conductive panel.

(b) The surface is deburred and brushed and then cleaned for 3 minutes in methylene chloride.

(c) Then a layered structure is produced which is comprised of:
 (1) a copper foil of 35 microns ($\mu$) which has been prepared for adhesion on one side by oxidation;
 (2) a layer of a pregregs 0.078 mm in thickness, preferably having a resin content of 60% and a flow value of 40%;
 (3) the aluminum carrier core;
 (4) a layer of prepreg as before;
 (5) a copper foil as before.

(d) The layered structure so formed is compressed for 40 minutes at 172° C., at a pressure between 12 and 18 bar, preferably between 14 and 16 bar, and is determined empirically according to the nature of the prepreg material or by measurement of the gel point, etc., in accordance with German Pat. No. 1,778,824, incorporated herein by reference.

(e) Then a positive pattern of conductive paths for the first plane (for example, for screening and current supply) is applied by an alkali-removable screen-printing ink; the exposed copper is etched away, for example, by means of cupric chloride, and the alkali-removable mask layer is removed at 45° C. by contacting with 5% caustic soda.

(f) After flushing and neutralizing in dilute sulphuric acid, with subsequent flushing, the panel is dried.

(g) After drying, an adhesion-promoting layer of preformed material is pressed against the surface at 150° C., for 5 minutes, at a pressure from 12 to 16 bar, preferably 14 bar.

(h) Onto this is applied the pattern of conductive paths of preformed wire which is provided with an insulating layer, for example, as described in German Pat. No. 1,906,967, incorporated herein by reference, and during the layering process is fastened to the surface using known techniques; the process is repeated, where necessary, on the second side.

(i) Onto this a layered structure is formed which, starting from the surface provided by the wire conductive paths, consists of a layer of a prepreg having low flow, preferably one having a resin content of 60% and a flow rate of 10%;
and of two layers of prepreg having high flow, as well as of a copper foil having a thickness of 35$\mu$ prepared one one side for adhesion promotion.

(j) The layered structure is compressed for 45 minutes at 172° C. and a suitable pressure of, for example, 12 to 16 bar, preferably 14 to 15 bar.

(k) Then, in the region of the perforations filled up with insulating material, the pattern of holes for the conductive paths is produced, that is, with a diameter which is greater by about 0.15 mm than the final diameter.

It is advantageous to make these holes by drilling at high drill speeds of, for example 32,000 r.p.m. and a feed speed of 50 $\mu$/min.

(l) After deburring and cleaning the surface, e.g., with fine emery paper, any residues are removed by flushing with a high pressure water jet at a pressure of 20 bar.

(m) Then the unit so prepared is treated for 30 minutes at 60° C. with a potassium premanganate solution, and after neutralizing and flushing in hot water, is immersed for 5 minutes at 20° C. in a hydrazine hydrate solution.

(n) After flushing in running water, the workpiece is cleaned by water at a pressure of 20 bar and the surface is chemically treated with sodium persulphate and flushed.

(o) After treatment in dilute hydrochloric acid for 5 minutes, the workpiece is catalyzed with a palladium-(II)-tin(II)chloride solution and the metal coating is built up by electroless metal deposition.

(p) After flushing and drying, the conductive panel is checked for satisfactory condition. Then, where necessary, the negative of the required conductive pattern is printed on the surface, or the surface is covered over altogeher where necessary, leaving free soldering eyes.

After electroless and/or galvanic deposition of a copper layer of, for example, $25\mu$ and, where necessary, an etch-resistant metal layer which, for example, consists of tin/lead and exhibits a thickness of $15\mu$, the covering layer is removed and the exposed copper is etched off in the normal manner.

The excess of the hole diameter may be selected within wide limits and typically lies, for example, between 0.05 and 0.1 mm.

If, for example, no pattern of conductive paths is needed for screening and current supply, there is no need for the copper foil described in step (c).

In another embodiment, the pattern of conductive paths for screening and current supply may be produced by the socalled additive or semi-additive methods of production, which are well known to those in the art, in which case a layer of an adhesion-promoter, e.g., according to the West German Pat. No. 1,665,314, incorporated herein by reference, advantageously takes the place of the copper foil.

Moreover, instead of the alkali-removable screen-printing ink described in step (e), any other suitable covering mask, inclusive of masks produced from photoprinting lacquers and photoprinting dry films, may be used.

Finally, also in accordance with this invention is the compressing procedure; in particular also that of the steps (g) and (j), may be performed by means of a roller press apparatus or the like, instead of by means of plate processes.

EXAMPLE 2

For the production of a conductive panel having a metal carrier after the style of a printed circuit, a procedure in accordance with the invention is as follows:

(a) Cutting off of the plate-like metal carrier, for example, from an aluminum sheet having a thickness of 0.8 mm;

(b) Drilling the hole pattern with a hole diameter layer by 0.6 mm with respect to the desired final diameter;

(c) Deburring;

(d) Etching the surface in 10% hydrochloric acid for 2 minutes;

(e) Flushing in running water for 5 minutes;

(f) Drying at 80° C. for 30 minutes;

(g) Compressing on both sides with, in each case, a layer of a prepreg 0.078 mm in thickness and having a resin content of 60% and a flow rate of 40%; and a layer of 0.2 mm in thickness of a copper-coated epoxy-resin-glass fabric, for example, at 122° C. and a pressure of 12 bar for 45 minutes, whereby a uniform molded laminate material is formed in which the perforations in the metal carrier are completely or substantially filled with an insulating material;

(h) Drilling the hole pattern with a diameter layer by 0.15 mm with respect to the desired final diameter, preferably at a drill speed of 32,000 r.p.m. and a drill feed of 50 $\mu$/min.;

(i) Deburring and cleaning;

(j) Applying a copper layer deposited electrolessly in accordance with known techniques and, with prior etching of the insulating layer surface in chromo-sulphuric acid at 50° C. for 10 minutes;

(k) Printing a mask corresponding with the negative conductive pattern, which is applied by means of screen or photo-printing;

(l) Galvanically or electrolessly metallizing the exposed areas, for example, the application of $25\mu$ of copper and $15\mu$ of lead/tin;

(m) Removing the mask layer and etching off of the exposed copper layer;

(n) Mechanical final processing;

(o) Annealing at 150° C. for 60 minutes;

(p) Final check.

EXAMPLE 3

The procedure of Example 2 is repeated, but instead of a metal carrier comprised of aluminum sheet, sheet steel of, for example, 0.4 mm in thickness is used; and instead of copper-coated epoxy-glass fabric, a layer of a resin mixture is applied which exhibits adhesion-promoting characteristics.

After the production of the hole pattern the conductive paths are built up by means of fully or semi-additive methods of production, which are well known, and the finished conductive panel is annealed at 150° C. for 60 minutes.

EXAMPLE 4

In modification of the methods of Examples 1 to 3, there is used as base material one which is catalyzed throughout for electroless metal deposition. Likewise, where necessary, an adhesion-promoting layer is employed which is catalyzed throughout for electroless metallizing.

In another embodiment of the invention, the carrier material of metal is provided with a number of perforations in excess of the number of those in the finished conductive panel, all of which are filled with an insulating material. Then, in the course of the production of the conductive panel only those fillings of insulating material in the holes are provided with holes or the like, the walls of which consist of insulating material and which correspond with the hole pattern of the finished conductive panel, while the insulating filling of the other perforations in the carrier is left intact.

Advantageously, the carrier material is provided with a plurality of perforations arranged in a desired pattern, for example, in the screen-like pattern usual for conductive panels, which get filled with insulating material.

It is thereby made possible, in the case of the production of conductive panels, to start out from a prepared base material which is suitable for a plurality of conductive panels exhibiting different conductor and functional hole patterns, and, thus, these can be manufactured in appropriate quantities.

In particular, in the case of the production of conductive panels the functional hole pattern of which is arranged in a screen as occurs, for example, with conductive panels for employment in the digital field, or, respectively, those which are employed in a plurality of integrated circuits, this further development of the invention enables a start to be made from a base material produced uniformly in series manufacture. This leads to a particularly economical manufacture of electrically conductive panels in which a carrier material of metal is used. This carrier material may be produced starting from metal carrier panels preholed in a screen, e.g., in panel sizes usual for molded laminate materials.

I claim:

1. A method for producing a molded laminate which is useful in the preparation of an electrically conductive panel, the molded laminate having
   (i) a carrier layer comprising a metal having on at least one side at least one layer of
   (ii) an insulating material capable of yielding free flow of heat, and on the external surface of the insulating layer
   (iii) an electrically conductive outer layer comprising copper, wherein the carrier layer is characterized by a plurality of perforations which have been substantially filled with the insulating material, the process comprising the steps of:
   A. forming a plurality of perforations in a metal panel;
   B. cleaning and deburring the surface of the metal panel and perforations;
   C. applying on at least one side of the panel at least one layer of an insulating material capable of yielding free flow of heat;
   D. applying an electrically conductive outer layer comprising copper on the surface of the layer of insulating material;
   E. heating the structure at a temperature of from 150° to 200° C. and applying a pressure of from 10 to 25 bar, for a period of 15 to 140 minutes, until the insulating material substantially fills the perforations, the diameter of the filled perforation being from 0.20 to 1 millimeter larger than the final desired hole diameter;
   F. applying a layer of an etch-resistant masking material on selected areas of the surface of the copper layer corresponding to the desired pattern of conductor lines;
   G. etching away the unmasked portions of copper from the surface of the insulating layer;
   H. thereafter removing the etch-resistant masking material from the masked areas of copper;
   I. applying a layer of adhesion promoting material; and
   J. providing a second pattern of conductor lines on the surface of the laminate structure.

2. The method of claim 1, which includes the further step of forming a through hole in at least some of said filled perforations, such that the diameter of the filled perforation is from 0.20 to 1 millimeter larger than the hole diameter.

3. The method of claim 2, in which the diameter of the filled perforation is from 0.4 to 0.8 millimeter larger than the hole diameter.

4. The method of claim 2, which includes the further steps of sensitizing the walls of the through holes to make them receptive to the electroless deposition of metal from an electroless metal deposition bath, and electrolessly depositing a layer of metal on the sensitized surface of the through holes.

5. The method of claim 2, which includes the further step of providing on one or both sides of the surface a layered structure comprising one layer of a prepreg having low flow characteristics and one or more layers of a prepreg having high flow characteristics and compressing the resulting article.

6. The method of claim 1, in which the electrically conductive outer layer comprises a copper-coated epoxy-glass resin or a copper foil.

7. The method of claim 1, in which the metal of the carrier layer is selected from among aluminum and steel.

8. The method of claim 1, in which the insulating layer comprises a prepreg having a resin content of 60% and a flow value of 40%.

* * * * *